(12) United States Patent
Heo et al.

(10) Patent No.: US 7,560,316 B2
(45) Date of Patent: Jul. 14, 2009

(54) THIN FILM TRANSISTOR PANEL AND MANUFACTURING METHOD THEREOF

(75) Inventors: Seong-Kweon Heo, Suwon-si (KR); Chun-Gi You, Hwaseong-si (KR); Min-Hyuk Choi, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 12 days.

(21) Appl. No.: 11/871,027

(22) Filed: Oct. 11, 2007

(65) Prior Publication Data

US 2008/0087904 A1    Apr. 17, 2008

(30) Foreign Application Priority Data

Oct. 11, 2006    (KR) ............... 10-2006-0098941

(51) Int. Cl.
  *H01L 21/84*    (2006.01)
  *H01L 33/00*    (2006.01)
(52) U.S. Cl. ............... 438/149; 349/113; 349/114; 257/89; 257/E33.001; 257/E21.7; 438/30
(58) Field of Classification Search ........... 438/149; 349/113, 114
See application file for complete search history.

(56) References Cited

U.S. PATENT DOCUMENTS

| 6,683,667 B2 * | 1/2004 | Jin et al. ............... 349/113 |
| 2004/0125280 A1 | 7/2004 | Kim et al. |
| 2004/0183970 A1 | 9/2004 | Niiya |
| 2006/0125987 A1 | 6/2006 | Chang et al. |
| 2007/0013839 A1 * | 1/2007 | Rho ............... 349/114 |
| 2007/0184587 A1 * | 8/2007 | You et al. ............... 438/149 |

FOREIGN PATENT DOCUMENTS

| JP | 2001-272674 | 10/2001 |
| JP | 2004-252047 | 9/2004 |
| JP | 2004-310036 | 11/2004 |
| JP | 2005-070736 | 3/2005 |
| KR | 1020040012029 | 2/2004 |
| KR | 1020040085789 | 10/2004 |

(Continued)

OTHER PUBLICATIONS

English Abstract for Publication No.: 2001-272674.

(Continued)

*Primary Examiner*—Tung S Lau
*Assistant Examiner*—Lawrence Tynes, Jr.
(74) *Attorney, Agent, or Firm*—F. Chau & Associates, LLC

(57) ABSTRACT

A thin film transistor array panel includes interconnection members interposed between the underlying gate pads made of an Al-containing metal and the overlying contact assistants made of a transparent conductor such as ITO thereon to prevent corrosion of Al due to ITO, or gate-layer signal transmission lines. Gate-layer signal transmission lines are directly connected to the data-layer signal transmission line to prevent corrosion of Al due to ITO in the thin film transistor array panel according to an embodiment of the present invention. The color filters are formed on the thin film transistor array panel to prevent misalignment between the two display panels so as to increase the aperture ratio.

14 Claims, 23 Drawing Sheets

FOREIGN PATENT DOCUMENTS

| | | |
|---|---|---|
| KR | 1020060004475 | 1/2006 |
| KR | 1020060022840 | 3/2006 |
| KR | 1020060041746 | 5/2006 |
| KR | 1020060068115 | 6/2006 |
| KR | 1020060070835 | 6/2006 |
| KR | 1020060083267 | 7/2006 |

OTHER PUBLICATIONS

English Abstract for Publication No.: 1020040012029.
English Abstract for Publication No.: 2004-252047.
English Abstract for Publication No.: 1020040085789.
English Abstract for Publication No.: 2004-310036.
English Abstract for Publication No.: 2005-070736.
English Abstract for Publication No.: 1020060004475.
English Abstract for Publication No.: 1020060022840.
English Abstract for Publication No.: 1020060041746.
English Abstract for Publication No.: 1020060068115.
English Abstract for Publication No.: 1020060070835.
English Abstract for Publication No.: 1020060083267.

\* cited by examiner

THIN FILM TRANSISTOR PANEL AND MANUFACTURING METHOD THEREOF

CROSS-REFERENCE TO RELATED FOREIGN APPLICATION

This application claims priority to and the benefit of Korean Patent Application No. 10-2006-0098941 filed in the Korean Intellectual Property Office on Oct. 11, 2006, the entire contents of which are herein incorporated by reference.

BACKGROUND OF THE INVENTION (a) Field of the Invention

The present disclosure is directed to a display panel for a liquid crystal display and a manufacturing method thereof.

(b) Description of the Related Art

Liquid crystal displays are one of the most widely used flat panel displays. A liquid crystal display includes a liquid crystal layer interposed between two panels each provided with field-generating electrodes. The liquid crystal display displays images by applying voltages to the field-generating electrodes to generate an electric field in the liquid crystal layer that determines orientations of liquid crystal molecules in the liquid crystal layer to adjust polarization of incident light. The light having an adjusted polarization is either intercepted or allowed to pass by a polarizing film, thereby displaying images.

Liquid crystal displays are categorized as non-emissive displays, and in that respect, they do not produce any form of light. Accordingly, a liquid crystal display utilizes artificial light emitted from lamps of a backlight unit separately provided, or ambient light, as a light source. Depending on the light sources employed by the liquid crystal display, a liquid crystal display is classified as a transmissive liquid crystal display or a reflective liquid crystal display. The light source of the transmissive liquid crystal display is backlight, and the light source of the reflective liquid crystal display is an external light. The reflective liquid crystal display is usually applied to a small or mid-size display device. A transflective liquid crystal display has been under development. The transflective liquid crystal display uses both a backlight and an external light as the light source depending on circumstances, and is usually applied to small or mid-size display devices.

A liquid crystal display includes two display panels. One of the display panels includes gate lines, data lines, pixel electrodes, and switching elements such as thin film transistors, and the other display panel includes color filters and a common electrode. These display panels are manufactured separately, and then the manufactured display panels are assembled into a liquid crystal display. The two panels may be misaligned during assembly such that the color filters may not correspond to each pixel area, thereby causing reduction of an aperture ratio.

In addition, the first mentioned display panel includes a plurality of pixels having switching elements and a plurality of display signal lines, and a gate driver having a plurality of stages transmitting gate signals to gate lines of the display signal lines to turn on/off the switching elements of the pixels.

Each stage of the gate driver is connected to one of the signal lines, and the stage receives a gate on/off voltage and a clock signal and transmits the inputted gate on/off voltage and clock signal to the signal line connected thereto. If the gate driver is formed outside of the substrate, pad portions, which connect the gate on/off signal lines to the stages of the gate driver, are required for transmitting the gate on/off voltage to the stages of the gate driver. Here, for connecting the pad portions to the signal lines, contact holes exposing the signal lines are formed, and then the signal lines are connected to the stages of the gate driver through the contact hole using a connecting member made of indium tin oxide (ITO), etc.

As the lengths of the signal lines increase along with the liquid crystal display size, which increases resistance of the lines, a signal delay or a voltage drop occurs due to the increased resistance. Wiring made of a material having low resistivity, such as aluminum (Al), is used.

However, if the signal lines including Al are directly contacted to ITO used in pixel electrodes or connecting members of a liquid crystal display, then the Al may become oxidized or corroded. Also, alignment errors may occur during assembling the two display panels, thereby causing a reduction of aperture ratio.

SUMMARY OF THE INVENTION

A thin film transistor array panel according to an embodiment of the present invention includes a substrate, a gate line formed on the substrate and including a gate pad for contact with an external driving circuit, a gate insulating layer formed on the substrate and having a first contact hole exposing the gate pad, a first semiconductor layer formed on the gate insulating layer, a data line formed on the gate insulating layer and the first semiconductor layer, and including a source electrode, a drain electrode disposed opposite the source electrode, a conductor formed on the gate insulating layer and connected to the gate pad through the first contact hole, a first passivation layer formed on the data line, the drain electrode, and the conductor, and having a second contact hole exposing the drain electrode, a reflective electrode formed on the first passivation layer, a color filter formed on the reflective electrode and the first passivation layer, and a transparent electrode formed on the color filter, connected to the drain electrode through the second contact hole, and also connected to the reflective electrode.

The thin film transistor array panel may further include a second passivation layer formed between the color filter and the reflective electrode. The color filter has a light hole, and the second passivation layer located under the light hole is removed.

The light hole may expose the second contact hole and a portion of the reflective electrode.

The transparent electrode may be physically and electrically connected to the exposed portion of the reflective electrode.

The passivation layer may have a third contact hole exposing a portion of the conductor, and the thin film transistor array panel may further include a contact assistant formed on the first passivation layer and connected to the conductor through the third contact hole.

The passivation layer may include an upper passivation layer and a lower passivation layer, and the upper passivation layer may have an embossed surface.

The thin film transistor array panel may further include a second semiconductor formed between the gate pad and the conductor. The second semiconductor may have a fourth contact hole aligned with the first contact hole, and the conductor may be connected to the gate pad through the first and fourth contact holes.

The second semiconductor may have substantially the same planer shape as the conductor except for the fourth contact hole.

The gate line may include aluminum or an aluminum alloy.

A manufacturing method of a thin film transistor array panel according to an embodiment of the present invention includes forming a first signal line on a substrate, depositing a gate insulating layer on the first signal line, depositing an intrinsic amorphous silicon (a-Si) layer on the gate insulating layer, depositing an extrinsic a-Si layer on the amorphous silicon layer, forming a photoresist film, having a position-dependent thickness and exposing a first portion of the extrinsic a-Si layer, on the extrinsic a-Si layer, forming a impurity semiconductor and an intrinsic semiconductor as well as a first contact hole exposing a portion of the first signal line simultaneously by patterning the extrinsic a-Si layer, the intrinsic a-Si layer, and the gate insulating layer using the photoresist film as mask, forming a second signal line and a drain electrode on the impurity semiconductor and a conductor connected to the first signal line through the first contact hole simultaneously, forming a passivation layer having a second contact hole exposing a portion of the drain electrode on the second signal line, the drain electrode, and the conductor, forming a reflective electrode on the passivation layer, forming a color filter on the reflective electrode and the passivation layer, and forming a transparent electrode connected to the drain electrode through the second contact hole, and also connected to the reflective electrode on the color filter.

The color filter may have a light hole. The manufacturing method may further include forming a second passivation layer on the reflective electrode and the color filter, and removing a portion of the second passivation layer exposed through the light hole. The light hole exposes the second contact hole and a portion of the reflective electrode.

The transparent electrode may be physically and electrically connected to the exposed portion of the reflective electrode.

The forming of the impurity semiconductor, the intrinsic semiconductor, and the first contact hole may include etching the first portion of the extrinsic a-Si layer, the underlying intrinsic a-Si layer, and the underlying gate insulating layer using the photoresist film as a mask, ashing the photoresist film thin to expose a second portion of the extrinsic a-Si layer, eliminating the second portion of the extrinsic a-Si layer, the underlying intrinsic a-Si layer, and the underlying gate insulating layer using the remaining photoresist layer as a mask, and eliminating the remaining photoresist film.

The forming the photoresist film may further include coating a photoresist, and exposing the photoresist to light through a mask having light transmitting transparent areas, translucent areas, and light blocking opaque areas. The light transmitting transparent areas correspond to the first portion of the extrinsic a-Si layer and the translucent areas correspond to the second portion of the extrinsic a-Si layer.

DETAILED DESCRIPTION OF THE EXEMPLARY EMBODIMENTS

Figure 1:
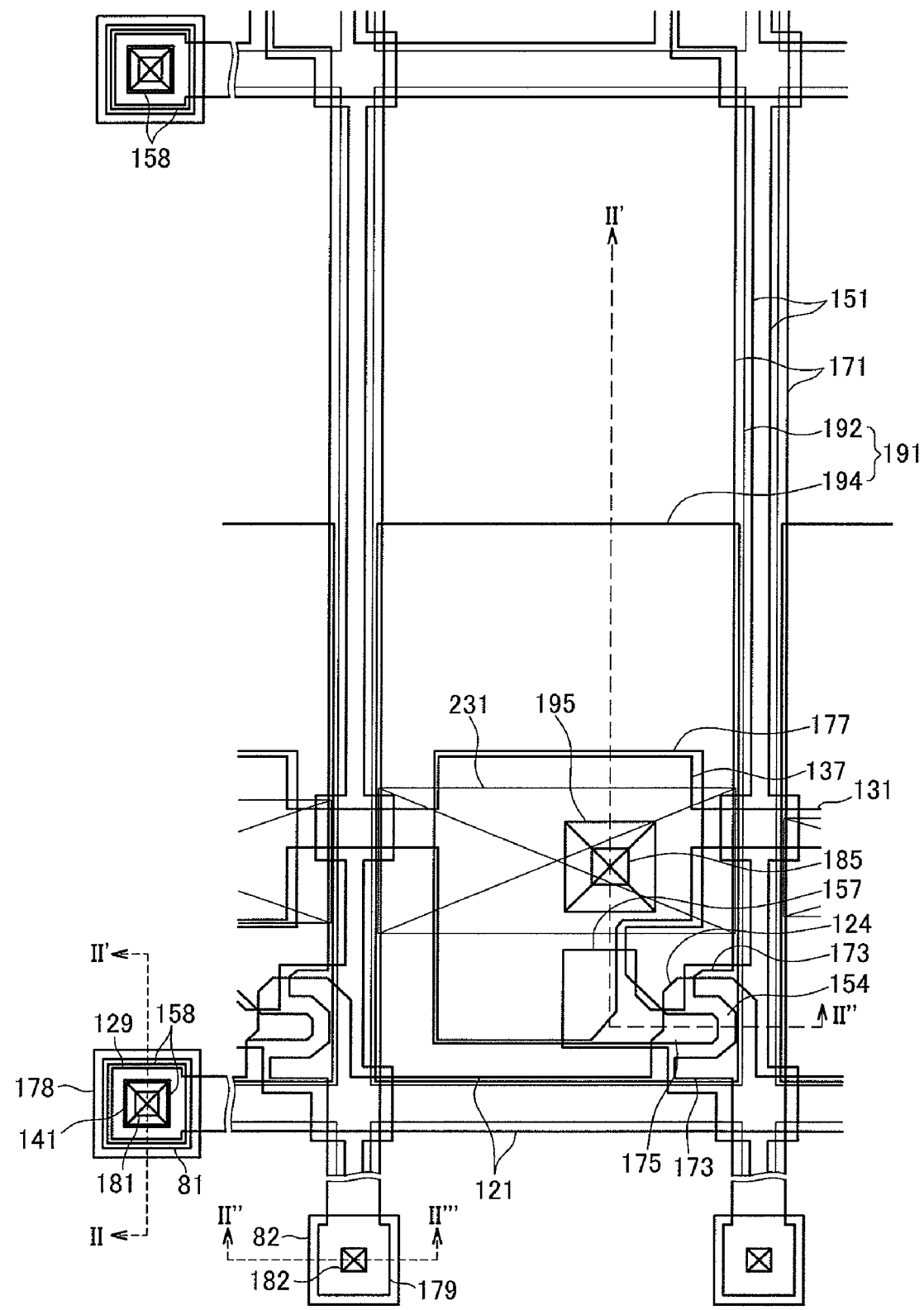
FIG. 1 is a layout view of a liquid crystal display according to an embodiment of the present invention.

Exemplary embodiments of the present invention will be described more fully hereinafter with reference to the accompanying drawings, in which the exemplary embodiments of the invention are shown. Like reference numerals designate like elements throughout the specification and drawings. As those skilled in the art would realize, the described embodiments may be modified in various different ways, all without departing from the spirit or scope of the present invention.

It will be understood that when an element such as a layer, film, region, or substrate is referred to as being "on" another element, it can be directly on the other element or intervening elements may also be present. Now, a liquid crystal display according to an embodiment of the present invention will be described in detail with reference to FIG. 1 to FIG. 3.

Figure 2:
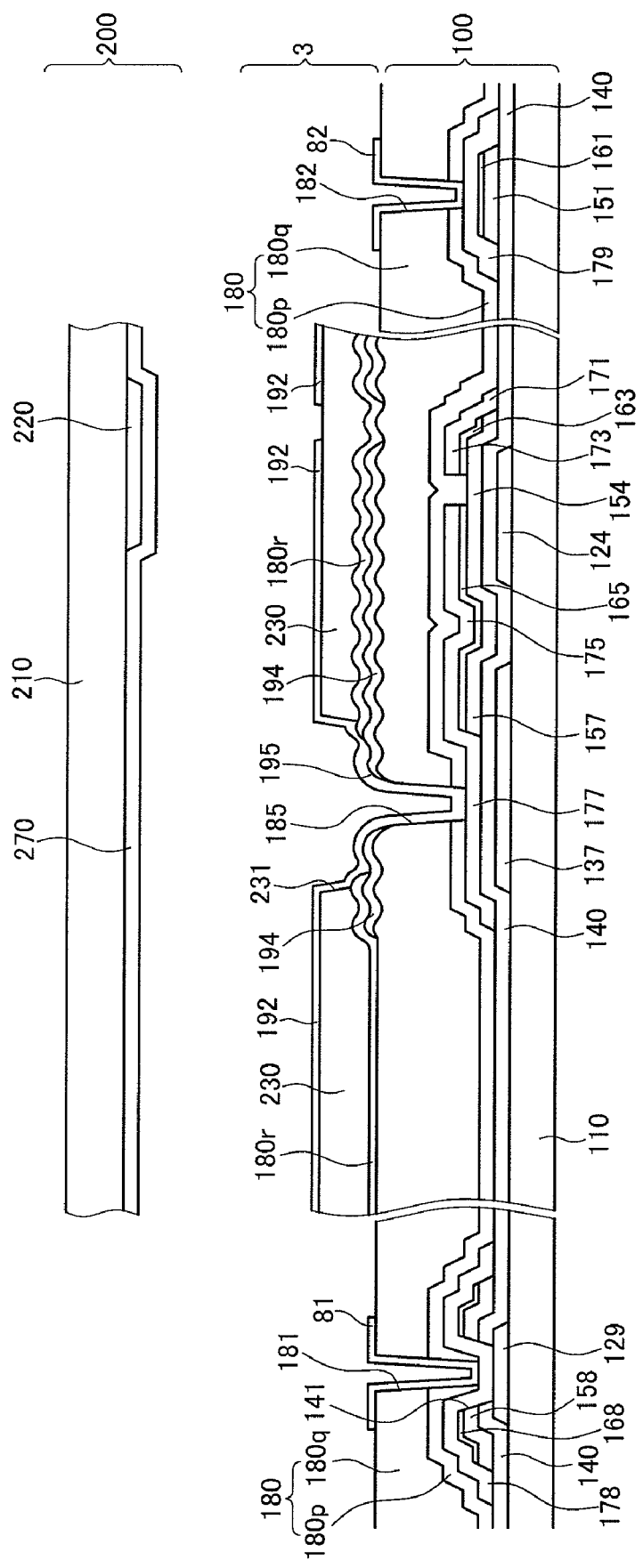
FIG. 2 is a sectional view of the liquid crystal display shown in FIG. 1 taken along the line II-II'-II"-II"'.
Figure 3:
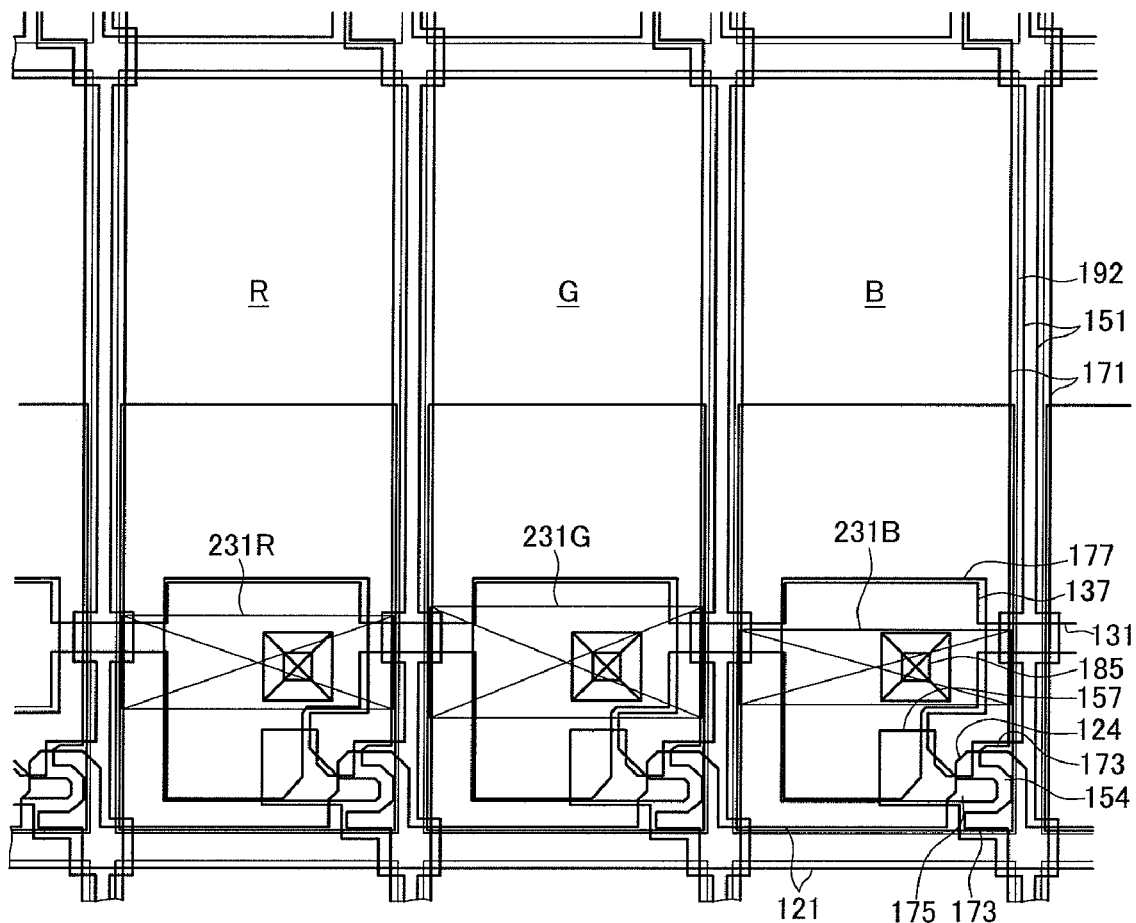
FIG. 3 is a layout view representing three pixels of a liquid crystal display according to an embodiment of the present invention.

FIG. 1 is a layout view of a liquid crystal display according to an embodiment of the present invention, FIG. 2 is a sectional view of the liquid crystal display shown in FIG. 1 taken along the line II-II'-II"-II"', and FIG. 3 is a layout view representing three pixels of a liquid crystal display according to an embodiment of the present invention.

As shown in FIG. 2, the liquid crystal display includes a thin film transistor array panel 100, a common electrode panel 200 facing the thin film transistor array panel 100, and an LC layer 3 interposed therebetween.

The transflective liquid crystal display includes a transmissive area TA and a reflective area RA defined by a transparent electrode 192 and a reflective electrode 194, respectively. In detail, areas disposed under and over an exposed portion of a transparent electrode 192 are transmissive regions TA, and areas disposed under and over a reflective electrode 194 are reflective regions RA. In the transmissive regions TA, light from a backlight unit (not shown) disposed under the thin film transistor array panel 100 passes through the LC layer 3 to display desired images. In the reflective regions RA, external light such as sunlight or ambient light that is incident thereon passes through the common electrode panel 200 and through the LC layer 3 to reach the reflective electrodes 194. Then, the external light is reflected by the reflective electrodes 194 and passes through the LC layer 3 again, to display desired images. In a liquid crystal display according to an embodiment of the present invention, the regions, which have the transparent electrode 192 or the reflective electrodes 194 to display images, are referred to as display areas hereinafter.

First, a thin film transistor array panel 100 according to an embodiment of the present invention will be described in detail.

A plurality of gate lines 121 and a plurality of storage electrode lines 131 are formed on an insulating substrate 110 made of a material such as transparent glass or plastic.

The gate lines 121 transmit gate signals and extend substantially in a horizontal direction. Each of the gate lines 121 includes a plurality of gate electrodes 124 projecting upward therefrom and a gate pad 129 having a large area for contact with another layer or an external driving circuit. A gate driving circuit (not shown) for generating the gate signals may be mounted on a flexible printed circuit ("FPC") film (not shown), which may be attached to the substrate 110, directly mounted on the substrate 110 or integrated onto the substrate 110. The gate lines 121 may extend to be connected to a driving circuit that may be integrated on the substrate 110.

The storage electrode lines 131 are supplied with a predetermined voltage and extend substantially parallel to the gate lines 121. Each of the storage electrode lines 131 is disposed between two adjacent gate lines 121 and is disposed closer to the lower of the two gate lines 121. Each of the storage electrode lines 131 includes a storage electrode 137 expanding upward and downward therefrom. However, the storage electrode lines 131 may have various shapes and arrangements.

The gate lines 121 and storage electrode lines 131 may be made of an Al-containing metal, such as Al and an Al alloy, having a low resistance for reducing a signal delay or a voltage drop. However, they may have a multilayered structure including two conductive layers (not shown) having different physical properties to each other, and they may be made of various metals or conductors.

The lateral sides of the gate lines 121 and the storage electrode lines 131 are inclined relative to a surface of the substrate 110, and the inclination angle thereof ranges from about 30 to 80 degrees.

A gate insulating layer 140 made of silicon nitride (SiNx) or silicon oxide (SiOx) is formed on the gate lines 121 and the storage electrode lines 131. The gate insulating layer 140 has a plurality of contact holes 141 exposing portions of the gate pads 129.

A plurality of semiconductor stripes 151 made of hydrogenated amorphous silicon (abbreviated to "a-Si") or polysilicon are formed on the gate insulating layer 140. Each of the semiconductor stripes 151 extends substantially in the longitudinal direction and includes a plurality of projections 154 branched out toward the gate electrodes 124 and a plurality of projections 157 branched out toward the storage electrode 137 from the projections 154. The semiconductor stripes 151 become wide near the gate lines 121 and the storage electrode lines 131 such that the semiconductor stripes 151 cover large areas of the gate lines 121 and the storage electrode lines 131.

A plurality of ohmic contact stripes and islands 161 and 165 are formed on the semiconductor stripes 151. The ohmic contact stripes and islands 161 and 165 may be made of n+ hydrogenated a-Si heavily doped with an n-type impurity such as phosphorous, or they may be made of silicide. Each ohmic contact stripe 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof may be in a range of about 30 to 80 degrees.

A plurality of data lines 171, a plurality of drain electrodes 175, and a plurality of interconnection members 178 are formed on the ohmic contact 161 and 165 and the gate insulating layer 140. Also, a plurality of ohmic contact islands 168 and a plurality of semiconductor islands 158 are disposed under the interconnection members 178.

The data lines 171 transmit data signals and extend substantially in the longitudinal direction to intersect the gate lines 121 and the storage electrode lines 131. Each data line 171 includes a plurality of source electrodes 173 projecting toward the gate electrodes 124, and a data pad 179 having a large area for contact with another layer or an external driving circuit. A data driving circuit (not shown) for generating the data signals may be mounted on an FPC film (not shown), which may be attached to the substrate 110, directly mounted on the substrate 110, or integrated with the substrate 110. The data lines 171 may extend to be connected to a driving circuit that may be integrated with the substrate 110.

The drain electrodes 175 are separated from the data lines 171 and are disposed opposite the source electrodes 173 with respect to the gate electrodes 124. Each of the drain electrodes 175 includes a wide end portion 177 and a narrow end portion. The wide end portion 177 overlaps a storage electrode 137 of a storage electrode line 131 and the narrow end portion is partly enclosed by a source electrode 173.

A gate electrode 124, a source electrode 173, and a drain electrode 175 along with a projection 154 of a semiconductor stripe 151 form a thin film transistor having a channel formed in the projection 154 disposed between the source electrode 173 and the drain electrode 175.

The interconnection member 178 covers the gate pad 129 exposed through the contact hole 141 of the gate insulating layer 140 to contact to the gate pad 129.

The data lines 171, the drain electrodes 175, and the interconnection members 178 may be made of a refractory metal such as Cr, Mo, Ta, Ti, or alloys thereof. However, they may have a multilayered structure including a refractory metal film (not shown) and a low resistivity film (not shown). However, the data lines 171, the drain electrodes 175, and the interconnection members 178 may be made of various metals or conductors.

The data lines 171, the drain electrodes 175, and the interconnection members 178 have inclined edge profiles, and the inclination angles thereof range from about 30 to 80 degrees.

The ohmic contacts 161, 163, 165, and 168 are interposed only between the underlying semiconductor layers 151, 154, and 158, and the overlying data line 171, drain electrode 175, and interconnection member 178 thereon, and reduce the contact resistance therebetween. Although the semiconductor stripes 151 are narrower than the data lines 171 at most places, the width of the semiconductor stripes 151 becomes large near the gate lines 121 and the storage electrode lines 131 as described above, to smooth the profile of the surface, thereby preventing the disconnection of the data lines 171. However, the semiconductor stripes 151 include some exposed portions, which are not covered with the data lines 171 and the drain electrodes 175, such as portions located between the source electrodes 173 and the drain electrodes 175.

A first passivation layer 180 is formed on the data lines 171, the drain electrodes 175, the interconnection members 178, and the exposed portions of the semiconductor stripes 151. The first passivation layer 180 includes a lower passivation film 180p made of an inorganic insulator such as silicon nitride or silicon oxide, and an upper passivation film 180q made of an organic insulator. The upper passivation film 180q may have a dielectric constant of less than about 4.0. The upper passivation film 180q has an embossed surface. However, the first passivation layer 180 may have a single-layer structure made of an inorganic or organic insulator.

Though not shown, in the liquid crystal display according to an embodiment of the present invention, the upper passivation film 180q of the first passivation layer 180 may have a different thickness in a reflective region and a transmissive region such that the thickness of the upper passivation film 180q in the reflective regions is twice as large as that in the transmissive regions.

The first passivation layer 180 has a plurality of contact holes 181, 182, and 185 exposing the interconnection member 178, the data pad 179, and the drain electrode 175, respectively.

A plurality of reflective electrodes 194 are formed on a portion of the first passivation layer 180 of the display area. Each reflective electrode 194 has a contact hole 195 exposing the whole of contact hole 185.

Each reflective electrode 194 has an embossed surface corresponding to the embossed surface of the upper passivation film 180q. The embossed surface of the reflective electrode 194 enhances reflective efficiency. The reflective electrodes 194 may be made of reflective metals such as Ag, Al, Cr, and alloys thereof. However, the reflective electrode 194 may have a double-layered structure including a reflective upper film of a low-resistivity material such as Al, Ag, and alloys thereof, and a lower film having good contact characteristics with indium tin oxide (ITO) or indium zinc oxide (IZO) such as a Mo-containing metal, Cr, Ta, and Ti.

A second passivation layer 180r is formed on the reflective electrodes 194 and the exposed first passivation layer 180 in the display areas. The second passivation layer 180r covers the reflective electrodes 194 to protect the reflective electrodes 194.

The second passivation layer 180r may be made of an inorganic insulator such as silicon nitride or silicon oxide, same as the lower layer 180p of the first passivation layer 180. Also, the lower layer 180p of the first passivation layer 180 and the second passivation layer 180r may have the same etching ratio as each other.

A plurality of color filters 230 are formed on the second passivation layer 180r. The color filters 230 may extend substantially in the longitudinal direction along the reflective electrodes 194 and the transparent electrodes 192, and the surface of the color filters 230 may be uniform. The color filters 230 may represent one of the primary colors such as red, green, and blue.

As described above, the thickness of the upper passivation film 180q in the reflective region may be thicker than that in the transmissive region, and may be twice as thick as that in the transmissive region. In this case, the thickness of the color filters 230 formed on the passivation film 180q in the reflective region may have a different thickness to that in the transmissive region such that the thickness of the color filters 230 in the reflective region may be half thick as that in the transmissive region.

The color filters of the transmissive regions may be thicker than the color filters of the reflective regions such that the difference of color tone between the transmissive regions and the reflective regions due to the number difference of light rays transmitting through the liquid crystal layer may be compensated.

The color filters 230 have a plurality of light holes 231 exposing the contact holes 185 and portions of the reflective electrodes 194. The size of the light holes 231 may be different according to the color filters 230. Referring to FIG. 3, the color filters 230 include red color filters R, green color filters G, and blue color filters B, and the size of the light holes 231G of the green color filters G may be the largest and the size of the light holes 231B of the blue color filters B may be the smallest.

The exposed portions of the second passivation layer 180r through the light holes 231 is removed such that the reflective electrodes 194 are exposed around the light holes 231 of the color filters 230. A plurality of transparent electrodes 192 are formed on the color filters 230, the exposed reflective electrodes 194, and the contact holes 185 of the first passivation layer 180. A plurality of contact assistants 81 and 82 are formed in the contact holes 181 and 182 of the first passivation layer 180.

The transparent electrodes 192 and the contact assistants 81 and 82 are made of a transparent conductive material such as ITO, IZO, etc.

The transparent electrodes 192, and the reflective electrodes 194, that are exposed through the light holes 231 of the color filters 230 and connected to the transparent electrodes 192, are physically and electrically connected to the drain electrodes 175 through the contact holes 185 such that the pixel electrodes 191 including the transparent electrodes 192 and the reflective electrodes 194 receive data voltages from the drain electrodes 175.

The pixel electrodes 191 that are supplied with the data voltages generate electric fields in cooperation with a common electrode 270 of the common electrode panel 200 that is supplied with a common voltage, which determine the orientations of liquid crystal molecules (not shown) of the liquid crystal layer 3 disposed between the two electrodes 191 and 270 to adjust polarization of the incident light passing through the liquid crystal layer 3.

A pixel electrode 191 and the common electrode 270 form a capacitor referred to as a "liquid crystal capacitor," which stores applied voltages after the thin film transistor turns off.

A pixel electrode 191 and a wide end portion 177 of a drain electrode 175 overlap a storage electrode 137 to form an additional capacitor referred to as a "storage capacitor," which enhances the voltage storing capacity of the liquid crystal capacitor.

The contact assistants 81 and 82 are connected to the interconnection member 178 and the data pad 179 through the contact holes 181 and 182, and cover them, respectively. The contact assistants 81 and 82 protect the interconnection member 178 and the data pad 179, and enhance the adhesion between them and external devices.

The interconnection members 178 are interposed between the underlying gate pads 129 made of an Al-containing metal and the overlying contact assistants 181 made of a transparent conductor such as ITO thereon to prevent corrosion of Al due to ITO.

A description of the common electrode panel 200 follows.

A light blocking member 220 is formed on an insulating substrate 210 made of a material such as transparent glass or plastic. The light blocking member 220 is referred to as a black matrix, and it prevents light leakage. The light blocking member 200 has a plurality of aperture regions facing the pixel electrodes 191. However, the light blocking member 220 may be formed on the thin film transistor array panel 100.

An overcoat layer made of an (organic) insulating material is formed on the light-blocking member 220 to provide a flat surface. The overcoat layer may be omitted.

Though not shown, the thickness of the overcoat in the reflective regions may be thicker than that in the transmissive region such that the difference in cell gaps of the reflective region and the transmissive region may be modified.

A common electrode 270 is formed on the overcoat. The common electrode 270 may be made of a transparent conductive material such as ITO, IZO, etc.

Alignment layers (not shown) for aligning the liquid crystal layer 3 may be coated on the insides of the display panels 100 and 200, and at least one polarizer (not shown) may be provided outside of the display panels 100 and 200.

The liquid crystal molecules (not shown) of the liquid crystal layer 3 may be vertically aligned or horizontally aligned.

The liquid crystal display may further include a plurality of elastic spacers (not shown) for supporting the display panels 100 and 200 to maintain cell gap between the thin film transistor array panel 100 and the common electrode panel 200.

The liquid crystal display may further include a sealant (not shown) for assembling the thin film transistor array panel 100 and the common electrode panel 200. The sealant may be located on the edge of the display panels 100 and 200.

Now, a manufacturing method of the thin film transistor array panel of the transflective liquid crystal display shown in FIG. 1 to FIG. 3 according to an embodiment of the present invention will be described in detail with reference to FIG. 4 to FIG. 18 along with FIG. 1 to FIG. 3.

Figure 17:
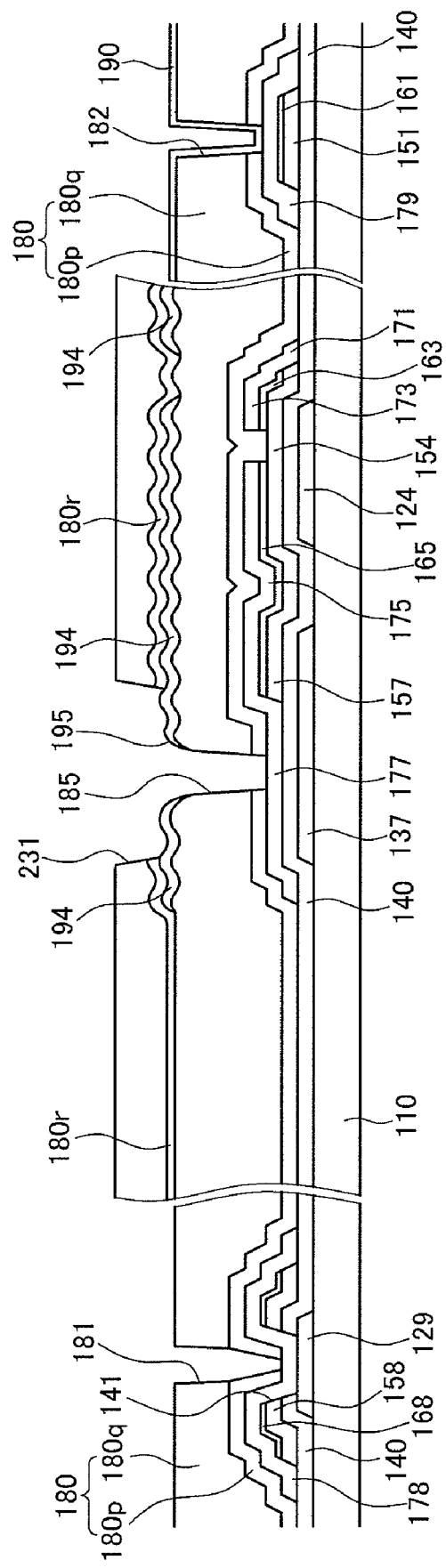
FIG. 17 and FIG. 18 are sectional views of a thin film transistor array panel in intermediate steps of a manufacturing method according to an embodiment of the present invention.
Figure 18:
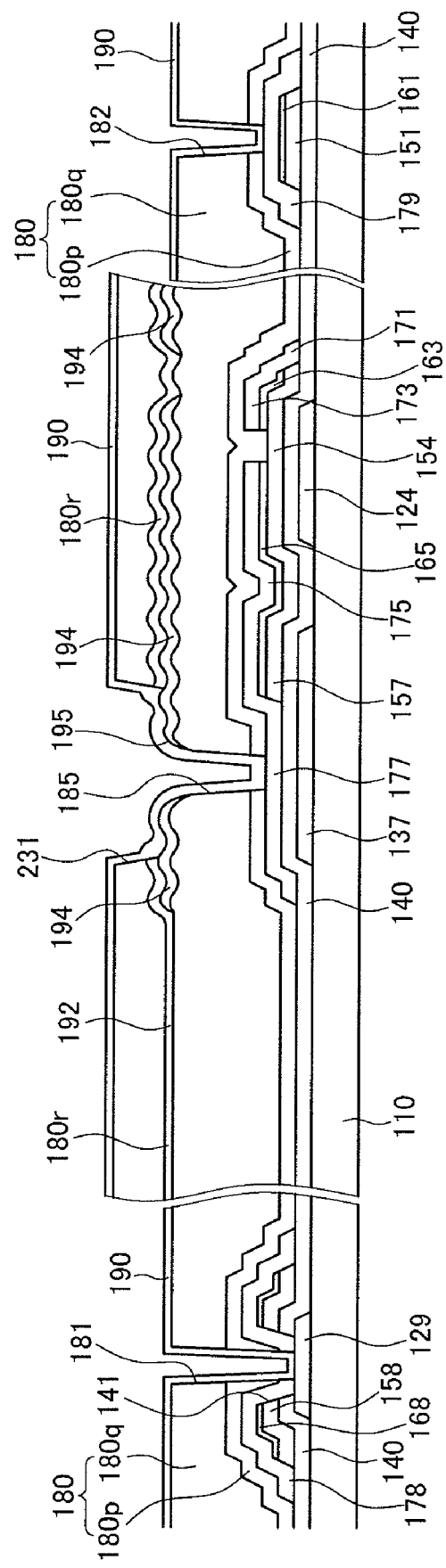

FIG. 4, FIG. 6, FIG. 9, FIG. 11, FIG. 13, and FIG. 15 are layout views of a thin film transistor array panel of the liquid crystal display shown in FIG. 1 and FIG. 2 in intermediate steps of a manufacturing method thereof according to an embodiment of the present invention. FIG. 5 is a sectional view of the thin film transistor array panel shown in FIG. 4 taken along the line V-V'-V''-V''', FIG. 7 is a sectional view of the thin film transistor array panel shown in FIG. 6 taken along the line VII-VII'-VII''-VII''', FIG. 8A to FIG. 8F are sectional views of the thin film transistor array panel shown in FIG. 6 and FIG. 7 in intermediate steps of a manufacturing method thereof, FIG. 10 is a sectional view of the thin film transistor array panel shown in FIG. 9 taken along the line X-X'-X''-X''', FIG. 12 is a sectional view of the thin film transistor array panel shown in FIG. 11 taken along the line XII-XII'-XII''-XII''', FIG. 14 is a sectional view of the thin film transistor array panel shown in FIG. 13 taken along the line XIV-XIV'-XIV''-XIV''', FIG. 16 is a sectional view of the thin film transistor array panel shown in FIG. 15 taken along the line XVI-XVI'-XVI''-XVI''', and FIG. 17 and FIG. 18 are sectional views of a thin film transistor array panel in intermediate steps of a manufacturing method according to the embodiment of the present invention.

Figure 4:
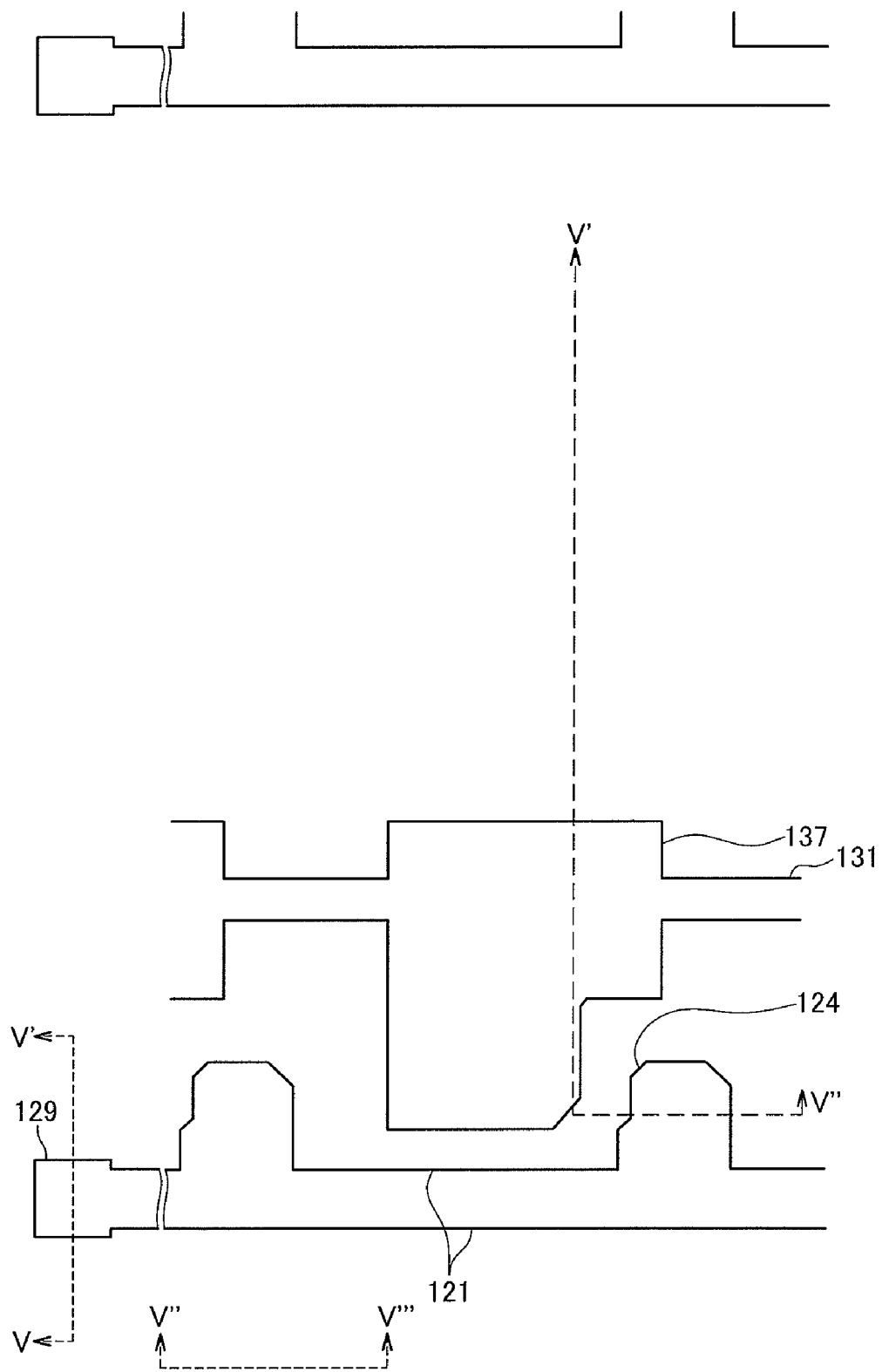
FIG. 4, FIG. 6, FIG. 9, FIG. 11, FIG. 13, and FIG. 15 are layout views of a thin film transistor array panel of the liquid crystal display shown in FIG. 1 and FIG. 2 in intermediate steps of a manufacturing method thereof according to an embodiment of the present invention.
Figure 5:
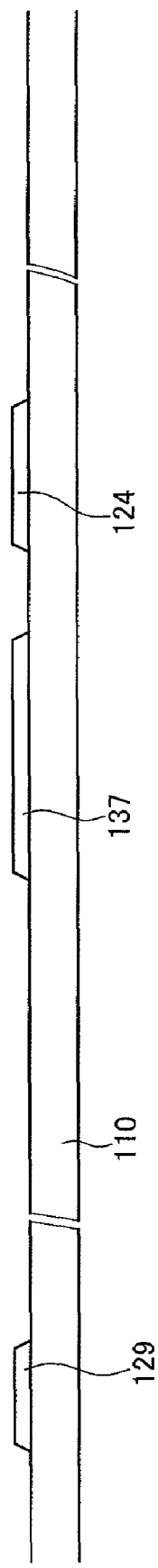
FIG. 5 is a sectional view of the thin film transistor array panel shown in FIG. 4 taken along the line V-V'-V"-V"'.

Referring to FIG. 4 and FIG. 5, an Al-containing metal layer such as such Al and Al alloy is deposited on a substrate 110, and then the metal layer is patterned by photolithography and etching to form a plurality of gate lines 121 including a plurality of gate electrodes 124 and gate pads 129, and a plurality of storage electrode lines 131 including a plurality of storage electrodes 137.

Figure 6:
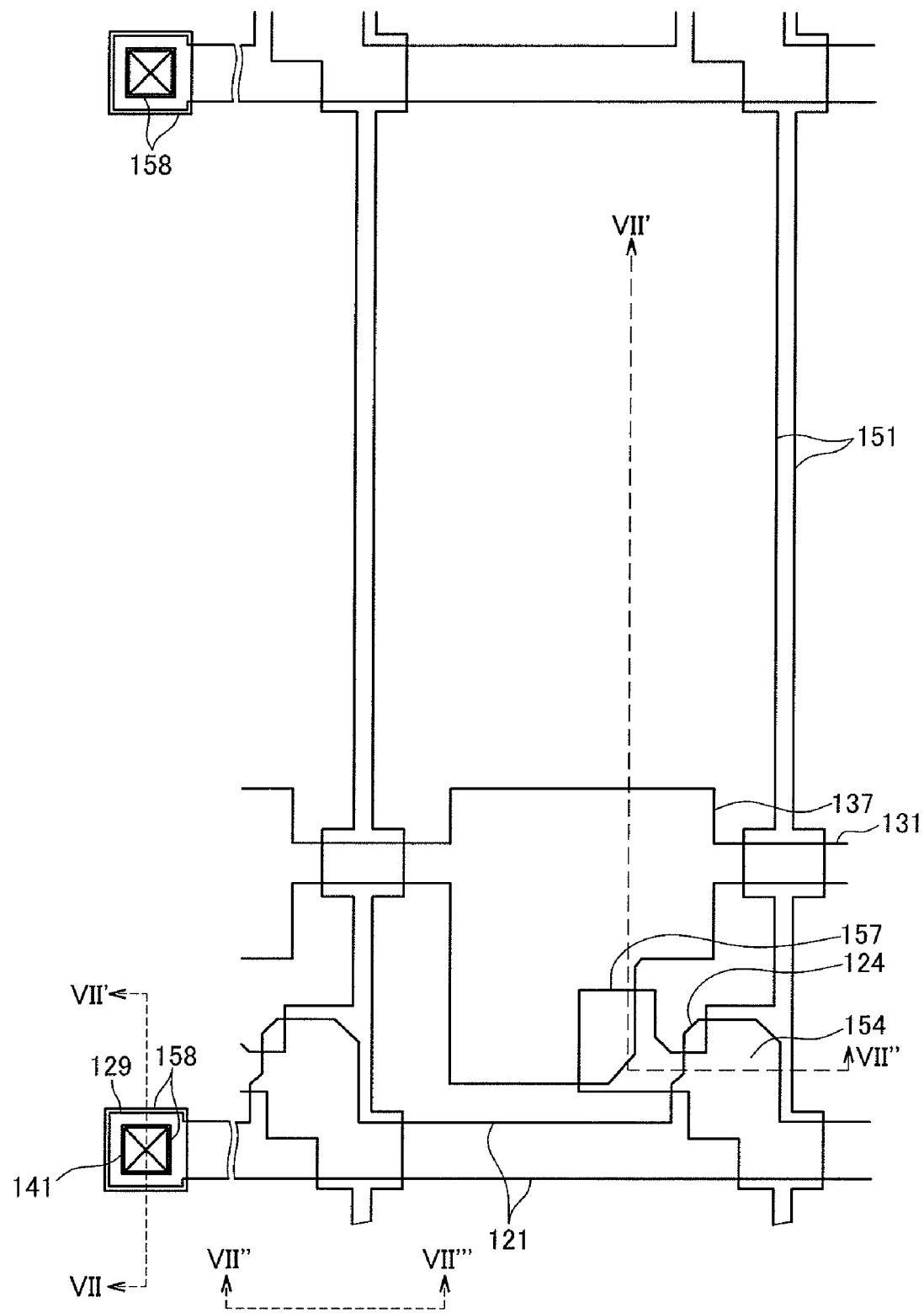
Figure 7:
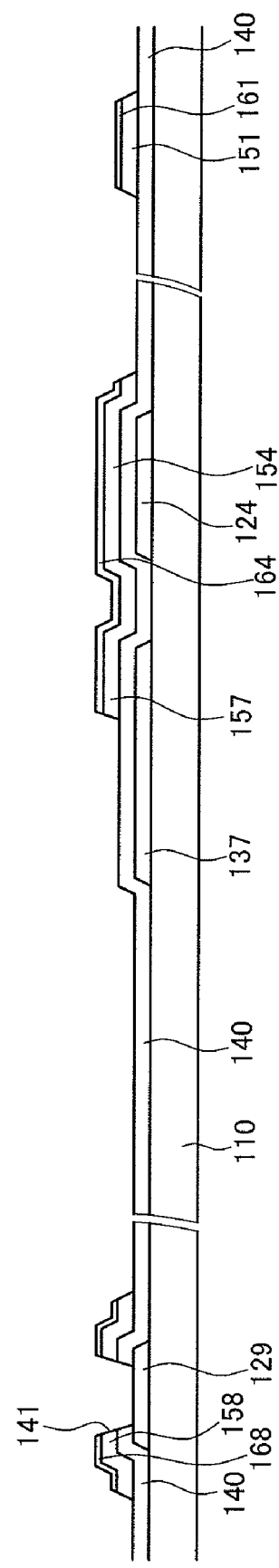
FIG. 7 is a sectional view of the thin film transistor array panel shown in FIG. 6 taken along the line VII-VII'-VII"-VII"'.

Referring to FIG. 6 and FIG. 7, a gate insulating layer 140, a plurality of semiconductor stripes 151 including projections 154 and 157, a plurality of semiconductor islands 158, a plurality of ohmic contact stripes 161 including projections 164, and a plurality of extrinsic semiconductor islands 168 are formed simultaneously by one photolithography step and by several etching steps. Here, the extrinsic semiconductor islands 168, the semiconductor islands 158, and the gate insulating layer 140 have a plurality of contact holes 141 exposing portions of the gate pads 129.

Now, the formation of the thin film transistor array panel shown in FIG. 6 and FIG. 7 will be described in more detail with reference to FIG. 8A to FIG. 8F.

Figure 8A:
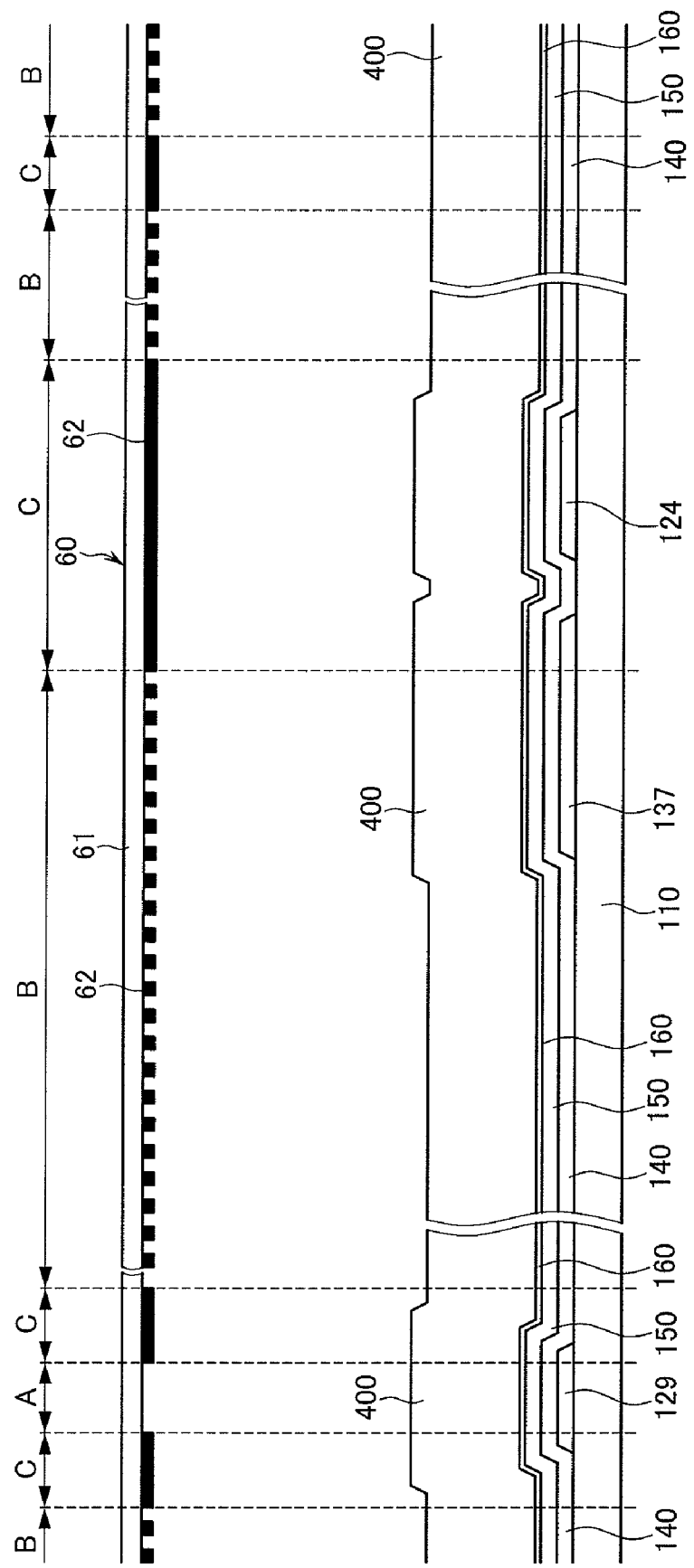
FIG. 8A to FIG. 8F are sectional views of the thin film transistor array panel shown in FIG. 6 and FIG. 7 in intermediate steps of a manufacturing method thereof.

Referring to FIG. 8A, the gate insulating layer 140, an intrinsic a-Si layer 150, and an extrinsic a-Si layer 160 are sequentially deposited on the substrate 110 by plasma enhanced chemical vapor deposition (PECVD), etc., and then a photoresist film 400 is coated thereon.

Next, the photoresist film 400 is exposed through an exposure mask 60, and an example of the exposure mask 60 is shown in the upper side of FIG. 8A.

The exposure mask 60 includes a substrate 61 and a plurality of opaque members 62 formed thereon. The exposure mask 60 and the substrate 110 are divided into light transmitting transparent areas A, translucent areas B, and light blocking opaque areas C depending on a distribution of the opaque members 62 of the exposure mask 60.

In the translucent areas B, the opaque members 62 are located with a predetermined distance, which is smaller than the resolution of a light exposer used for the photolithography, to be referred to as a slit pattern. There are no opaque members 62 in the light transmitting transparent areas A, and the opaque members 62 cover completely in the light blocking opaque areas C.

The translucent areas B may have a lattice pattern, or a thin film(s) with intermediate transmittance or intermediate thickness instead of the slit pattern.

Figure 8B:
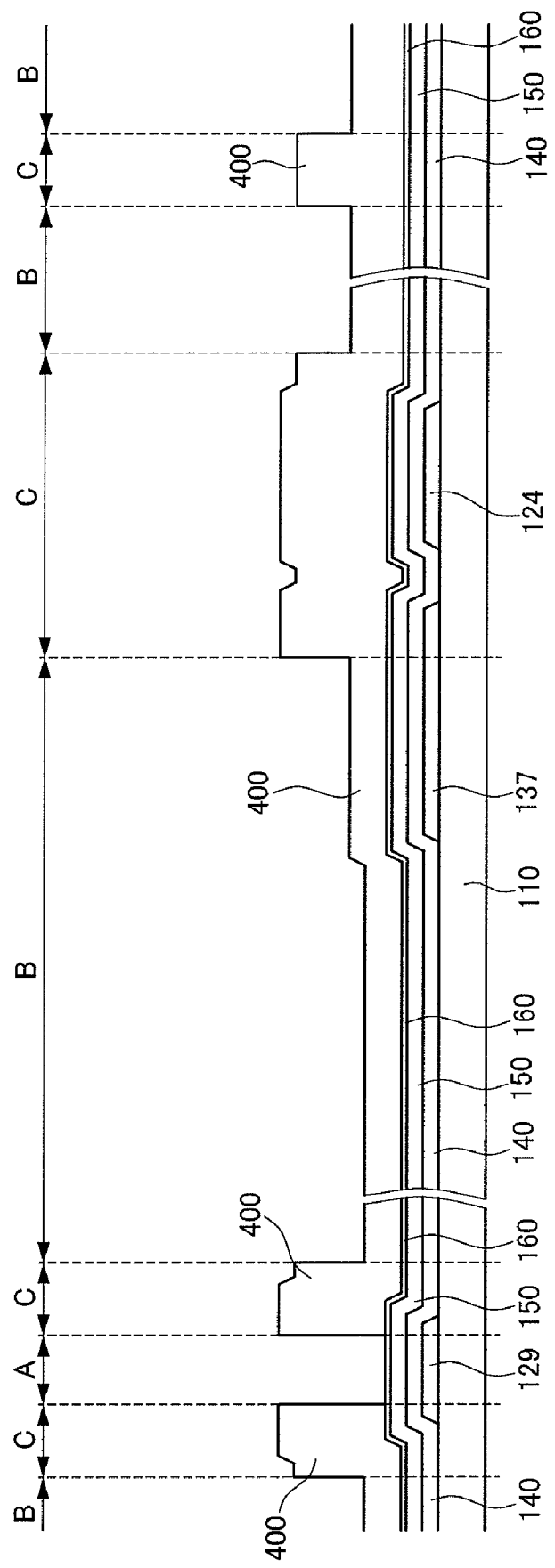

The photoresist film 400 is exposed to light through the exposure mask 60 and then the exposed photoresist film 400 is developed. As shown in FIG. 8B, the developed photoresist film 400 has a position-dependent thickness such that the photoresist film 400 located in the light transmitting transparent areas A is eliminated, that located in the translucent areas B is reduced, and that located in the light blocking opaque areas C is not removed at all.

Here, a thickness ratio of the photoresist film 400 located in the light blocking opaque areas C to the photoresist film 400 located in the translucent areas B is adjusted depending upon the process conditions in the subsequent process steps. The thickness of the photoresist film 400 located in the translucent areas B may be equal to or less than half of the thickness of the photoresist film 400 located in the light blocking opaque areas C.

The position-dependent thickness of the photoresist film may also be obtained by using a reflowable photoresist. In detail, once a photoresist pattern made of a reflowable material is formed by using a normal exposure mask with only transparent areas and opaque areas, it is subject to a reflow process to flow onto areas without the photoresist, thereby forming thin portions.

Figure 8C:
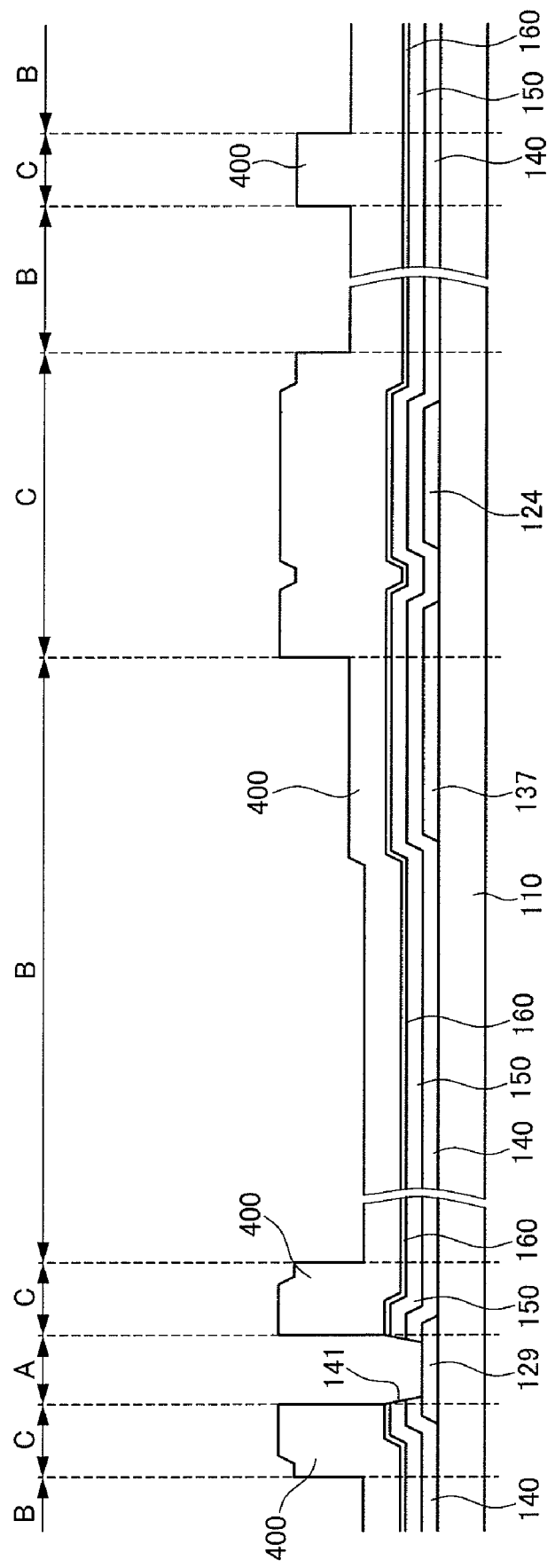

Next, as shown in FIG. 8C, the impurity a-Si layer 160, the intrinsic a-Si layer 150, and the gate insulating layer 140 are etched using the remaining photoresist film 400 as a mask to eliminate the impurity a-Si layer 160, intrinsic a-Si layer 150, and gate insulating layer 140 located in the light transmitting transparent areas A such that the contact holes 141 exposing the gate pads 129 are formed in the gate insulating layer 140.

Figure 8D:
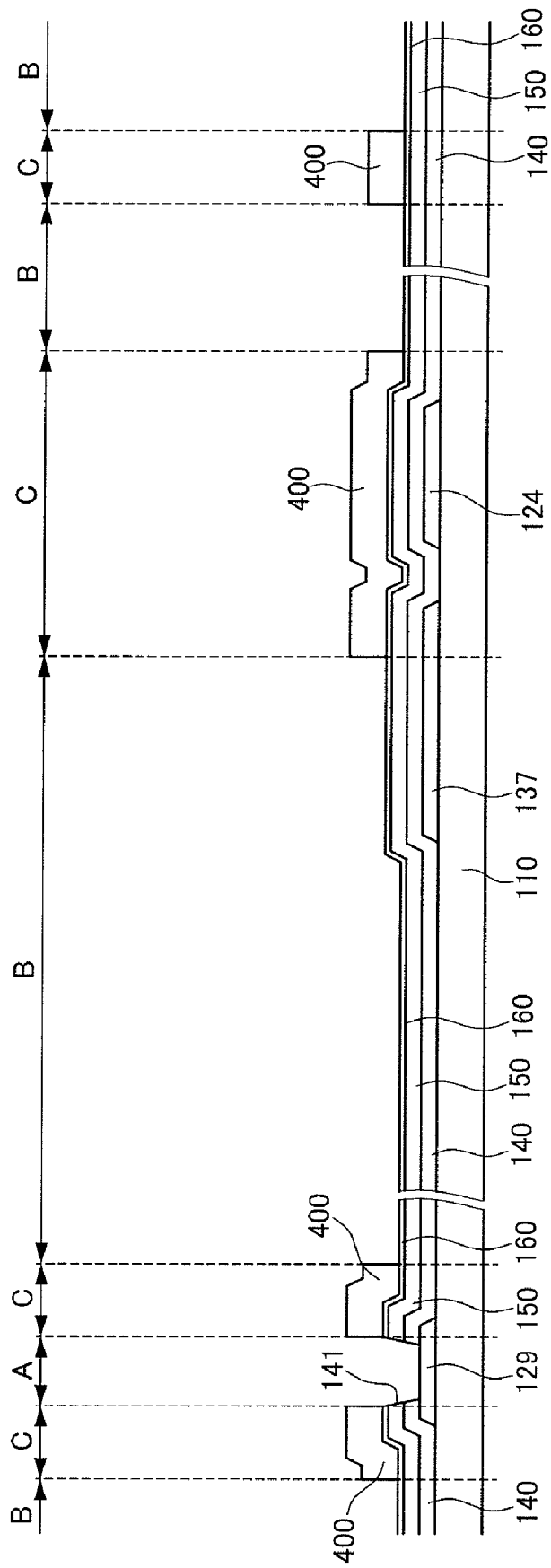

As shown in FIG. 8D, an ashing is performed on the photoresist film 400 such that the photoresist film disposed in the translucent areas B is completely eliminated and the thickness of the photoresist film disposed in the light blocking opaque areas C becomes thin.

Figure 8E:
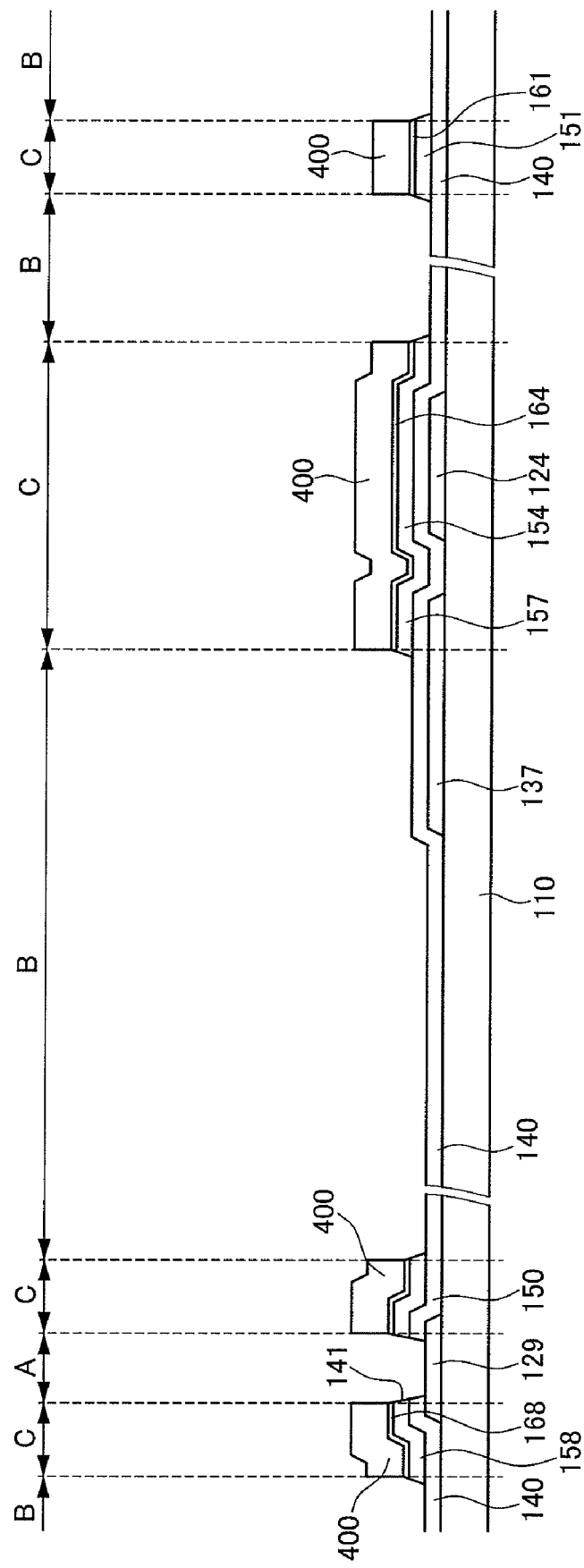

Referring to FIG. 8E, the impurity a-Si layer 160 and the intrinsic a-Si layer 150 are etched using the remaining photoresist film 400 located in the light blocking opaque areas C as a mask to form the extrinsic semiconductor stripes 161, including projections 164 and islands 168, and the intrinsic semiconductor stripes 151, including projections 154, 157 and islands 158.

Figure 8F:
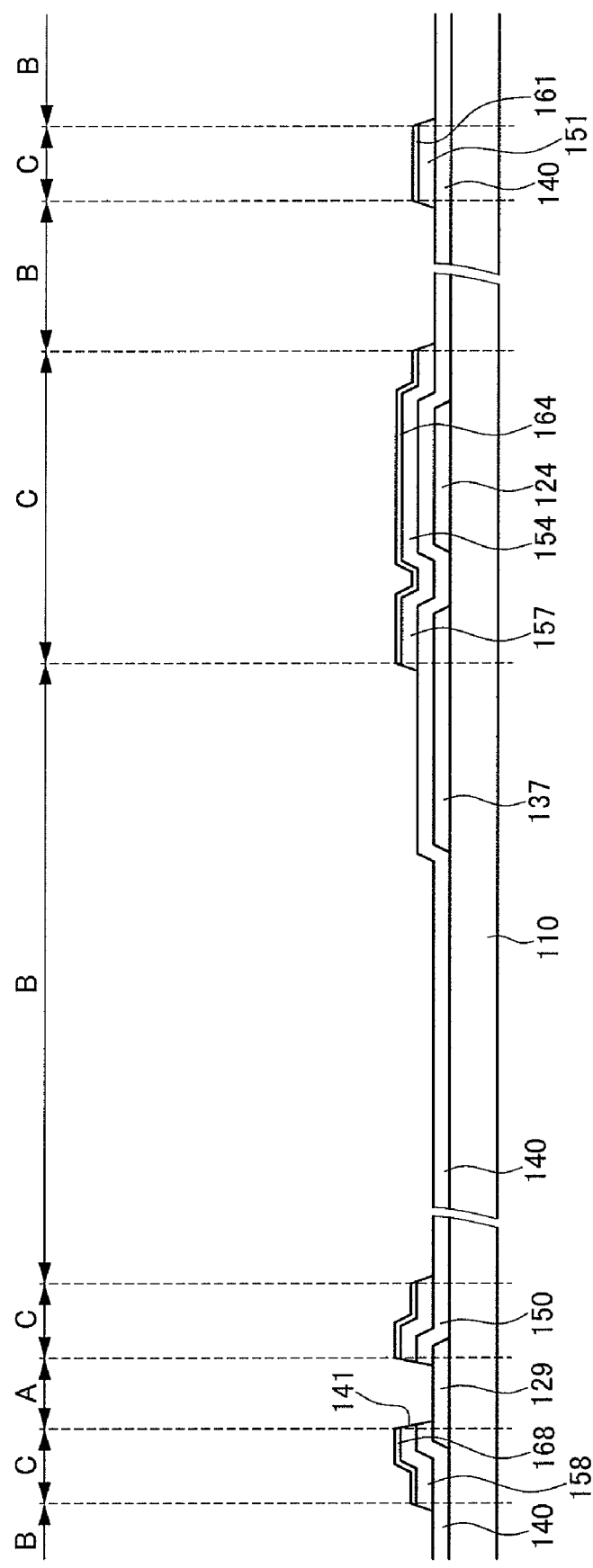

Finally, the remaining photoresist film 400 located in the light blocking opaque areas C is eliminated by ashing, etc. as shown in FIG. 8F.

As described above, the gate insulating layer 140, the intrinsic a-Si layer 150, and the impurity a-Si layer 160 are patterned using one exposure mask to simultaneously form the contact holes 141 exposing the gate pads 129 in the gate insulating layer 140 and to form the extrinsic semiconductor stripes 161 and the intrinsic semiconductor stripes 151 such that an additional exposure mask is not required to reduce the production cost.

Figure 9:
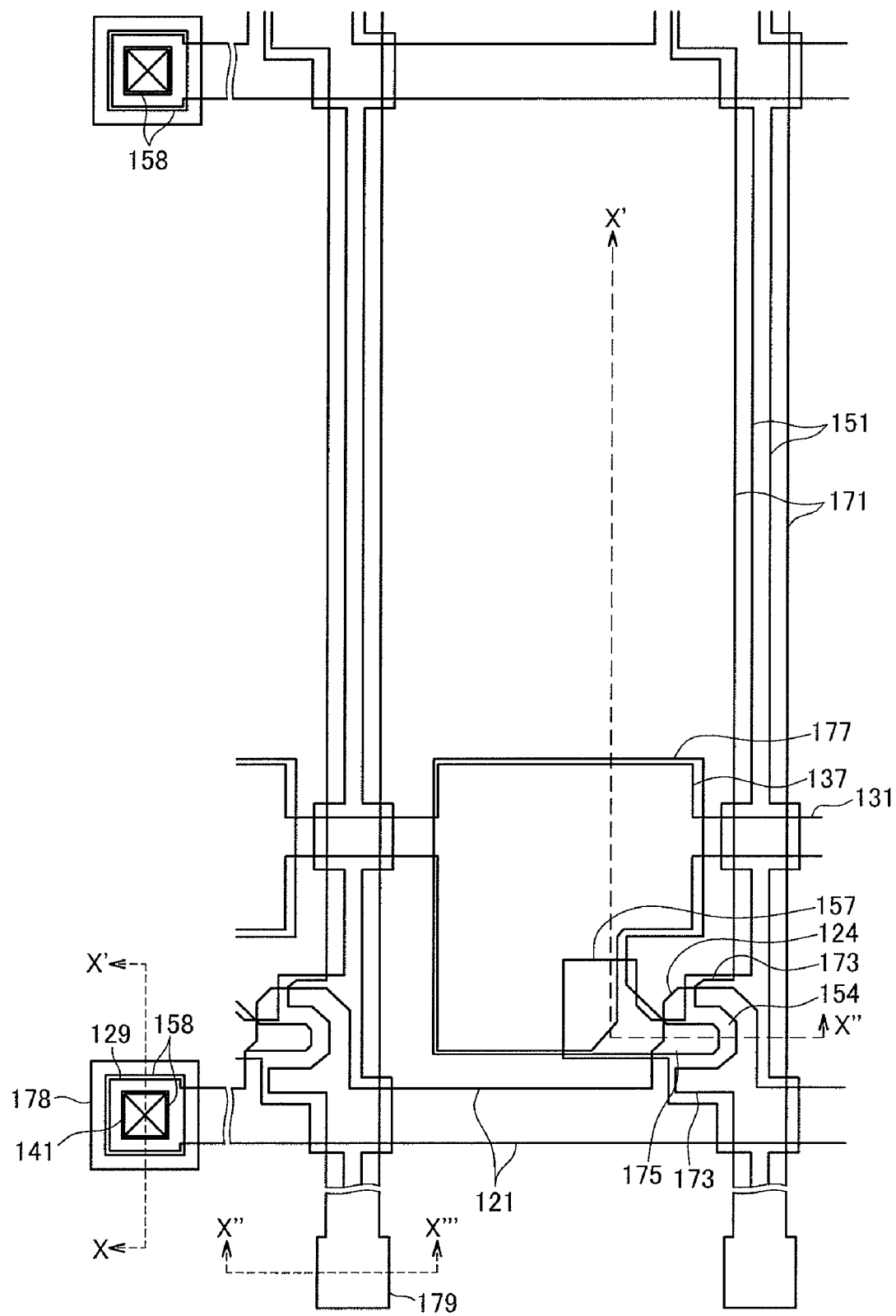
Figure 10:
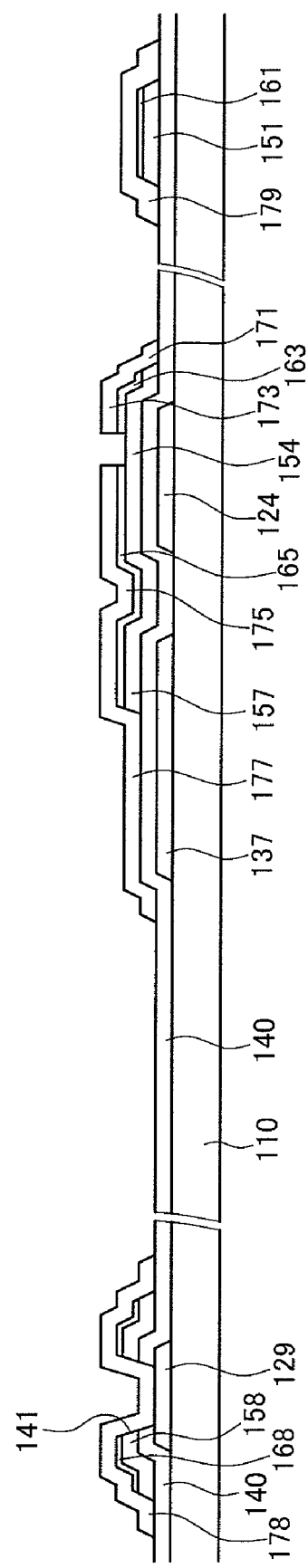
FIG. 10 is a sectional view of the thin film transistor array panel shown in FIG. 9 taken along the line X-X'-X"-X"'.

As shown in FIG. 9 and FIG. 10, a metal layer is deposited on the extrinsic semiconductor stripes 161 and 164 and the gate insulating layer 140, and then the metal is patterned by photolithography and etching to form a plurality of data lines 171 including source electrodes 173 and data pads 179, a plurality of drain electrodes 175, and a plurality of interconnection members 178 and wide-end portions 177.

Thereafter, exposed portions of the extrinsic semiconductor stripes 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

Figure 11:
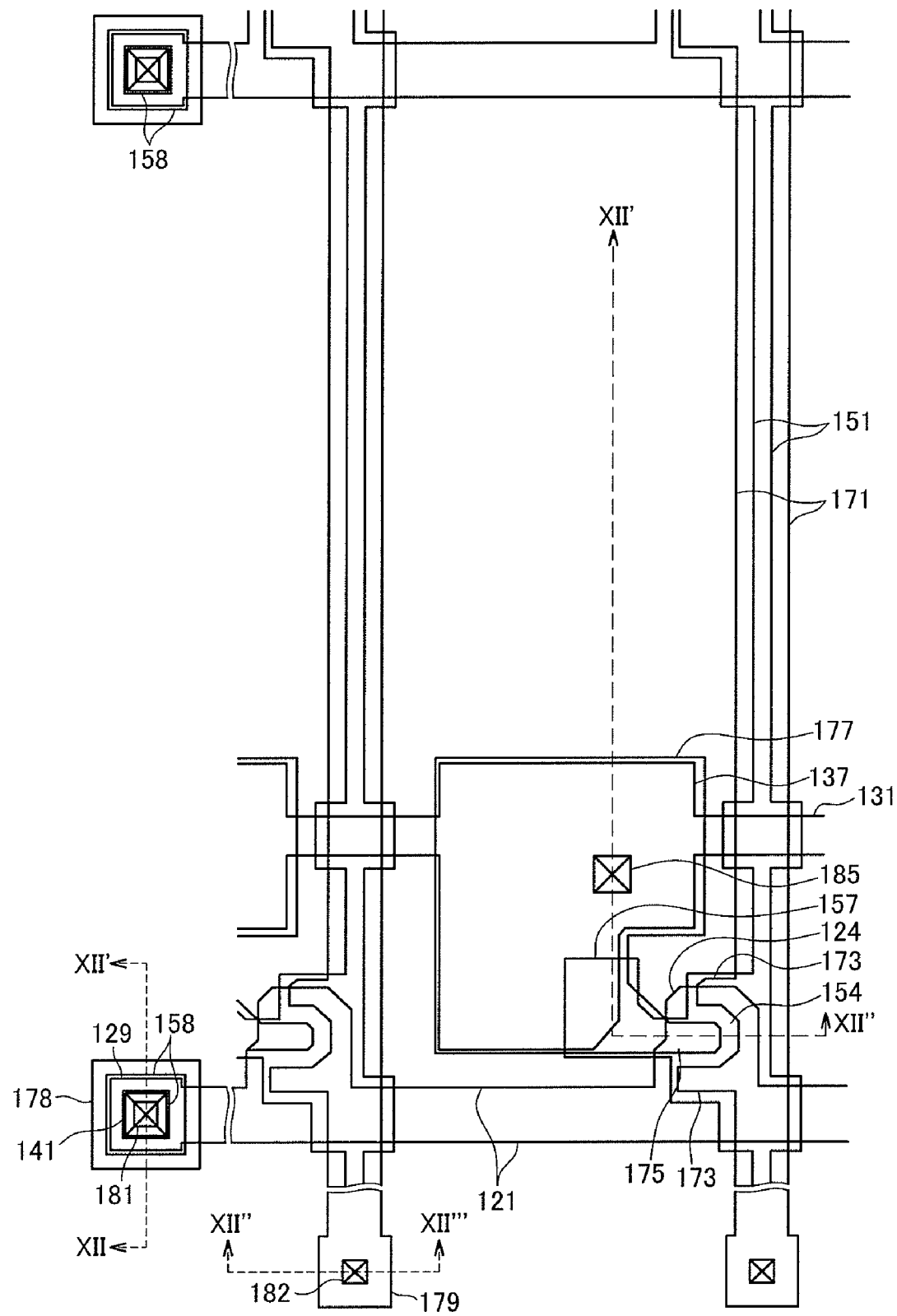
Figure 12:
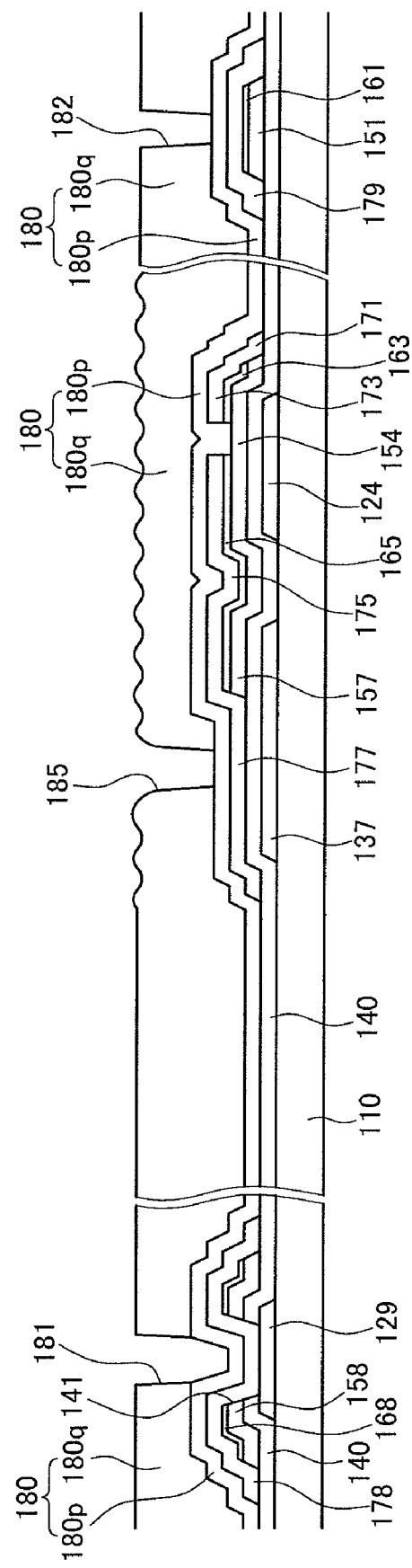
FIG. 12 is a sectional view of the thin film transistor array panel shown in FIG. 11 taken along the line XII-XII'-XII"-XII"'.

Next, as shown in FIG. 11 and FIG. 12, a passivation layer 180 including a lower layer 180p made of an inorganic insulator and an upper passivation film 180q made of an organic insulator is deposited, and then the upper passivation film 180q is exposed and developed to form a plurality of contact holes 181, 182, and 185 in the upper passivation film 180q. Here, the upper passivation film 180q located in the reflective regions is exposed through a slit mask (not shown) and developed to form an embossed surface of the upper passivation film 180q.

In addition, though not shown, the thickness of the upper passivation film 180q may have a position-dependent thickness by using a slit mask as an exposure mask such that the thickness of the upper passivation film 180q in the reflective regions may be twice as large as that in the transmissive regions.

Figure 13:
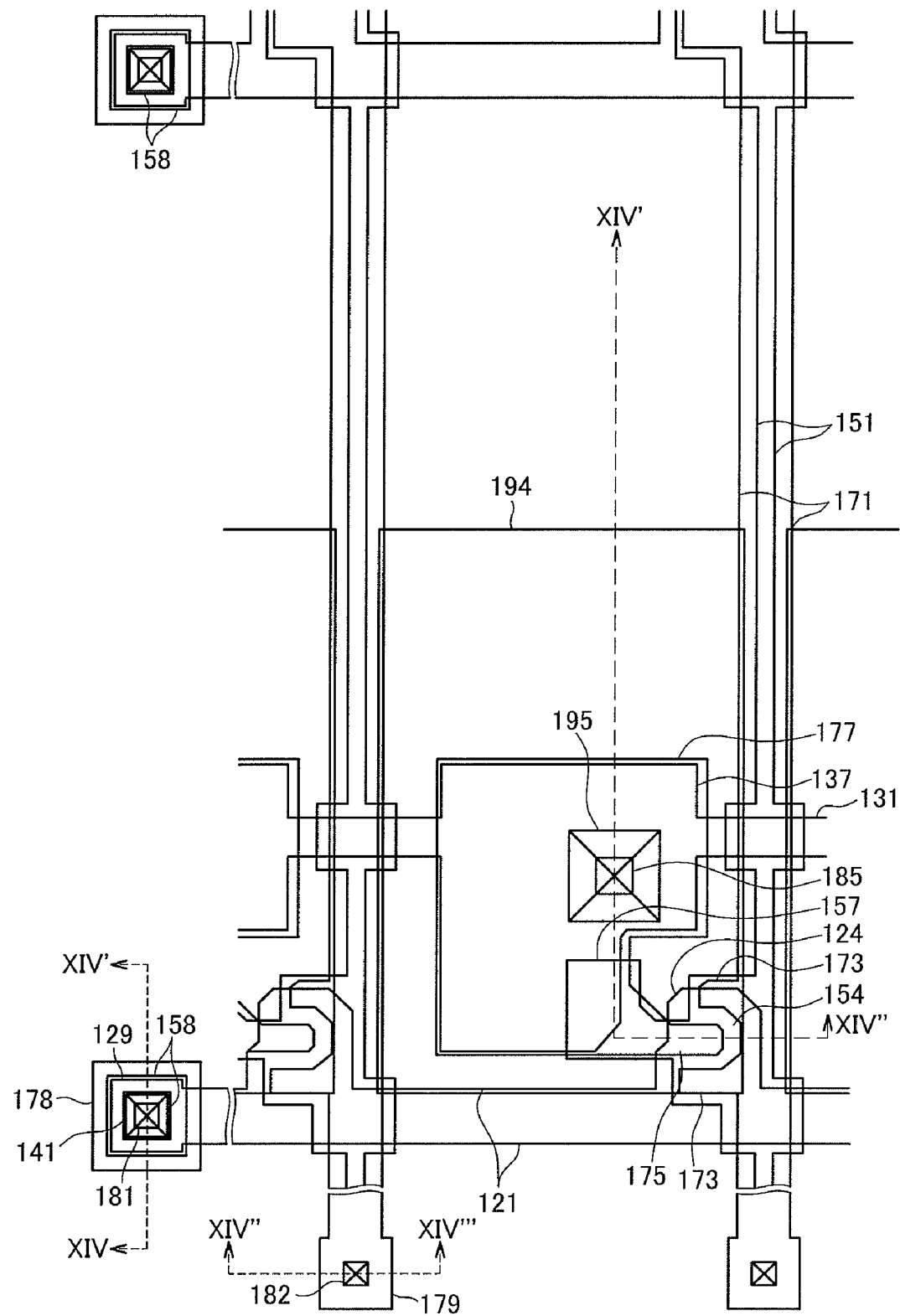
Figure 14:
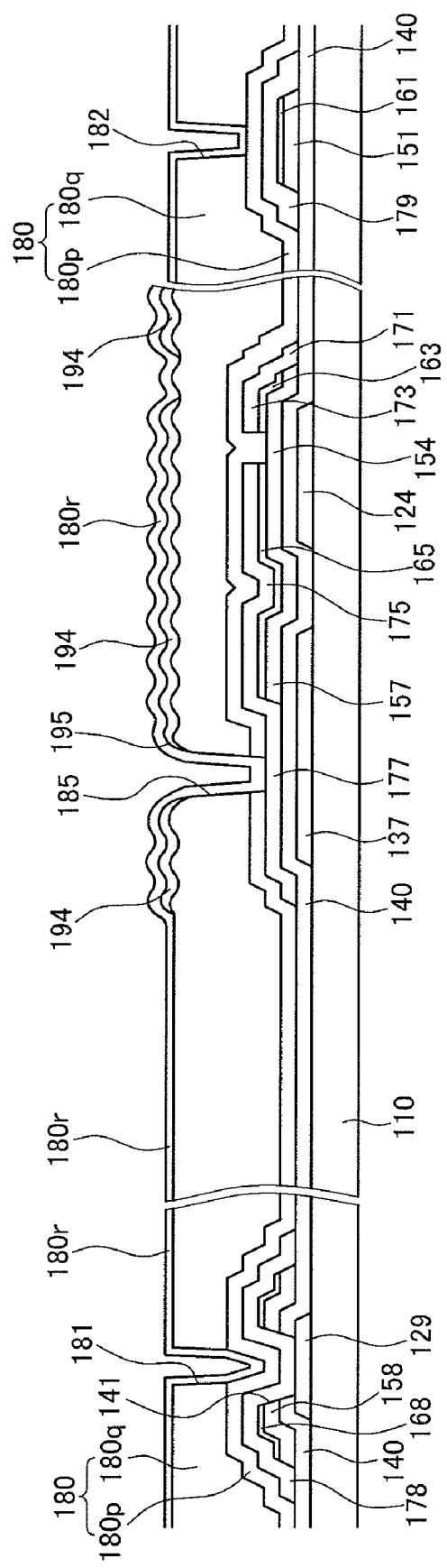
FIG. 14 is a sectional view of the thin film transistor array panel shown in FIG. 13 taken along the line XIV-XIV'-XIV"-XIV"'.

Referring to FIG. 13 and FIG. 14, a plurality of reflective electrodes 194 having a plurality of contact holes 195 exposing the whole of the contact holes 185 are formed on the upper organic layer 180q, and then a second passivation layer 180r is deposited on the whole of the substrate.

Figure 15:
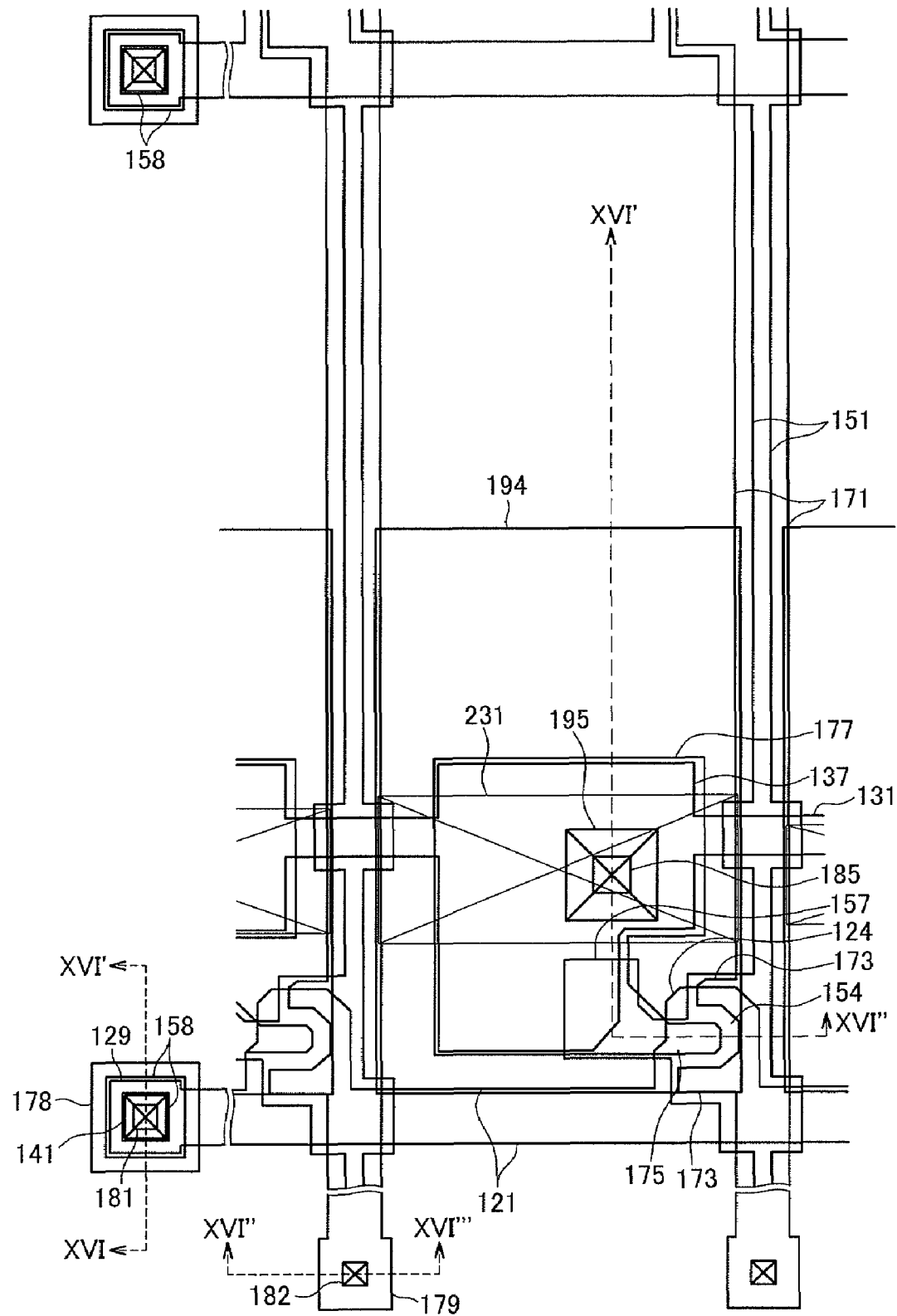
Figure 16:
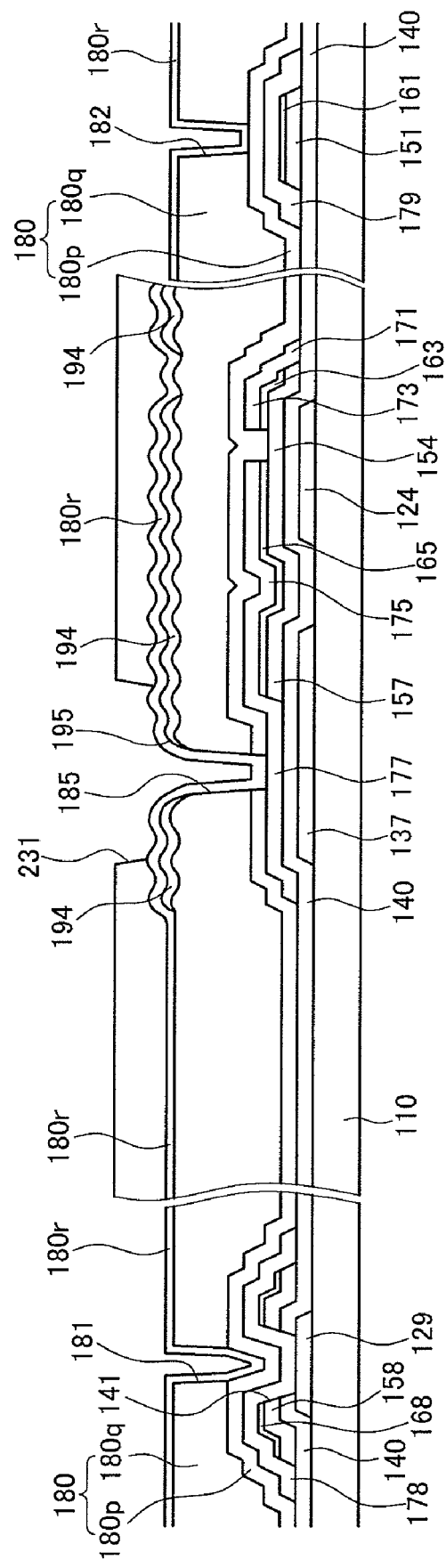
FIG. 16 is a sectional view of the thin film transistor array panel shown in FIG. 15 taken along the line XVI-XVI'-XVI"-XVI"'.

Referring to FIG. 15 and FIG. 16, a plurality of color filters 230 having a plurality of light holes 231 exposing portions of the reflective electrodes 194 are formed on the second passivation layer 180r. Here, the second passivation layer 180r prevents the underlying reflective electrodes 194 from contacting the overlying color filter 230s to protect the reflective electrodes 194.

Referring to FIG. 17, the second passivation layer 180r not covered with the color filters 230 is etched and removed, and the lower layer 180p of the first passivation layer 180 having the same etching ratio as the second passivation layer 180r is also etched simultaneously to complete the contact holes 185, 181, and 182 exposing the drain electrodes 185, the interconnection members 178 covering the gate pads 129, and the data pads 179, respectively. Here, the second passivation layer 180r, which is located on the reflective electrodes 194 under the light holes 231, is also removed to expose portions of the reflective electrodes 194.

Referring to FIG. 18, a transparent layer 190 made of ITO or IZO is deposited on the entire substrate. The deposited transparent layer 190 is patterned by photolithography and etching to form a plurality of transparent electrodes 192 and a plurality of contact assistants 81 and 82 as shown in FIG. 1 and FIG. 2.

The transparent electrodes 192 are located on the exposed reflective electrodes 194 such that the transparent electrodes 192 and the reflective electrodes 194 are physically and electrically connected to each other.

As described above, a thin film transistor array panel according to an embodiment of the present invention includes interconnection members interposed between the underlying gate pads made of an Al-containing metal and the overlying contact assistants made of a transparent conductor such as ITO thereon to prevent corrosion of Al due to ITO, or gate-layer signal transmission lines. Also, gate-layer signal transmission lines are directly connected to the data-layer signal transmission line to prevent corrosion of Al due to ITO in the thin film transistor array panel according to an embodiment of the present invention.

Further, the color filters are formed on the thin film transistor array panel to prevent a misalignment between the two display panels so as to increase the aperture ratio.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a substrate;
a gate line formed on the substrate and including a gate pad for contact with an external driving circuit;
a gate insulating layer formed on the substrate and having a first contact hole exposing the gate pad;
a first semiconductor layer formed on the gate insulating layer;
a data line formed on the gate insulating layer and the first semiconductor layer, and including a source electrode;
a drain electrode disposed opposite the source electrode;
a conductor formed on the gate insulating layer and connected to the gate pad through the first contact hole;
a first passivation layer formed on the data line, the drain electrode, and the conductor, and having a second contact hole exposing the drain electrode;
a reflective electrode formed on the first passivation layer;
a color filter formed on the reflective electrode and the first passivation layer; and
a transparent electrode formed on the color filter, connected to the drain electrode through the second contact hole, and also connected to the reflective electrode.

2. The thin film transistor array panel of claim 1, further comprising:
a second passivation layer formed between the color filter and the reflective electrode,
wherein the color filter has a light hole, and the second passivation layer located under the light hole is removed.

3. The thin film transistor array panel of claim 2, wherein the light hole exposes the second contact hole and a portion of the reflective electrode.

4. The thin film transistor array panel of claim 3, wherein the transparent electrode is physically and electrically connected to the exposed portion of the reflective electrode.

5. The thin film transistor array panel of claim 1, wherein the first passivation layer has a third contact hole exposing a portion of the conductor, and further comprising a contact assistant formed on the first passivation layer and connected to the conductor through the third contact hole.

6. The thin film transistor array panel of claim 1, wherein the passivation layer includes an upper passivation layer and a lower passivation layer, and the upper passivation layer has a embossed surface.

7. The thin film transistor array panel of claim 1, further comprising:
a second semiconductor formed between the gate pad and the conductor,
wherein the second semiconductor has a fourth contact hole aligned with the first contact hole, and the conductor is connected to the gate pad through the first and fourth contact holes.

8. The thin film transistor array panel of claim 7, wherein the second semiconductor has substantially the same planer shape as the conductor except for the fourth contact hole.

9. The thin film transistor array panel of claim 1, wherein the gate line includes aluminum or an aluminum alloy.

10. A manufacturing method of a thin film transistor array panel, comprising:
forming a first signal line on a substrate;
depositing a gate insulating layer on the first signal line;
depositing an intrinsic amorphous silicon (a-Si) layer on the gate insulating layer;
depositing an extrinsic a-Si layer on the amorphous silicon layer;
forming a photoresist film, having a position-dependent thickness and exposing a first portion of the extrinsic a-Si layer, on the extrinsic a-Si layer;
forming an impurity semiconductor and an intrinsic semiconductor as well as a first contact hole exposing a portion of the first signal line simultaneously by patterning the extrinsic a-Si layer, the intrinsic a-Si layer, and the gate insulating layer using the photoresist film as mask;
forming a second signal line and a drain electrode on the impurity semiconductor and a conductor connected to the first signal line through the first contact hole simultaneously;
forming a passivation layer having a second contact hole exposing a portion of the drain electrode on the second signal line, the drain electrode, and the conductor;
forming a reflective electrode on the passivation layer;
forming a color filter on the reflective electrode and the passivation layer; and
forming a transparent electrode connected to the drain electrode through the second contact hole, and also connected to the reflective electrode on the color filter.

11. The manufacturing method of claim 10, further comprising:
forming a second passivation layer between the reflective electrode and the color filter; and
removing a portion of the second passivation layer exposed through the light hole,
wherein the light hole exposes the second contact hole and a portion of the reflective electrode.

12. The manufacturing method of claim 11, wherein the transparent electrode is physically and electrically connected to the exposed portion of the reflective electrode.

13. The manufacturing method of claim 10, wherein forming of the impurity semiconductor, the intrinsic semiconductor, and the first contact hole comprises:
etching the first portion of the extrinsic a-Si layer, the underlying intrinsic a-Si layer, and the underlying gate insulating layer using the photoresist film as a mask;
ashing the photoresist film thin to expose a second portion of the extrinsic a-Si layer;
eliminating the second portion of the extrinsic a-Si layer, the underlying intrinsic a-Si layer, and the underlying gate insulating layer using the remaining photoresist film as a mask; and
eliminating the remaining photoresist film.

14. The manufacturing method of claim 13, wherein forming the photoresist film comprises:
coating a photoresist; and
exposing the photoresist to light through a mask having light transmitting transparent areas, translucent areas, and light blocking opaque areas,
wherein, the light transmitting transparent areas correspond to the first portion of the extrinsic a-Si layer and the translucent areas correspond to the second portion of the extrinsic a-Si layer.

* * * * *